(12) United States Patent
Rauhala et al.

(10) Patent No.: US 9,998,081 B2
(45) Date of Patent: Jun. 12, 2018

(54) METHOD AND APPARATUS FOR PROCESSING AN AUDIO SIGNAL BASED ON AN ESTIMATED LOUDNESS

(75) Inventors: Jukka Vesa Rauhala, Vantaa (FI); Koray Ozcan, Farnborough (GB)

(73) Assignee: Nokia Technologies Oy, Espoo (FI)

( * ) Notice: Subject to any disclaimer, the term of this patent is extended or adjusted under 35 U.S.C. 154(b) by 318 days.

(21) Appl. No.: 13/697,425

(22) PCT Filed: May 12, 2010

(86) PCT No.: PCT/IB2010/052113
§ 371 (c)(1),
(2), (4) Date: Feb. 4, 2013

(87) PCT Pub. No.: WO2011/141772
PCT Pub. Date: Nov. 17, 2011

(65) Prior Publication Data
US 2013/0144615 A1    Jun. 6, 2013

(51) Int. Cl.
| | |
|---|---|
| G10L 21/02 | (2013.01) |
| H03G 3/20 | (2006.01) |
| G10L 25/69 | (2013.01) |
| H03G 3/30 | (2006.01) |
| H03G 7/00 | (2006.01) |
| G10L 21/00 | (2013.01) |
| G10L 21/0364 | (2013.01) |
| G10L 21/0324 | (2013.01) |

(52) U.S. Cl.
CPC .............. *H03G 3/20* (2013.01); *G10L 21/00* (2013.01); *G10L 21/02* (2013.01); *G10L 25/69* (2013.01); *H03G 3/301* (2013.01); *H03G 7/002* (2013.01); *G10L 21/0324* (2013.01); *G10L 21/0364* (2013.01)

(58) Field of Classification Search
None
See application file for complete search history.

(56) References Cited

U.S. PATENT DOCUMENTS 7,177,803 B2 *   2/2007  Boillot ................... G10L 19/26
                                                                                  704/209
7,454,331 B2   11/2008  Vinton et al.
(Continued)

FOREIGN PATENT DOCUMENTS

WO    2004/111994 A2   12/2004
WO    2007/106384 A1    9/2007
(Continued)

OTHER PUBLICATIONS

"Zwicker's Loudness Model", Appendix A, 2005, pp. 91-100.
(Continued)

*Primary Examiner* — Richard Zhu
(74) *Attorney, Agent, or Firm* — Alston & Bird LLP

(57) ABSTRACT

An apparatus comprising at least one processor and at least one memory including computer program code. The at least one memory and the computer program code is configured to, with the at least one processor, cause the apparatus at least to determine a loudness estimate of a first audio signal, generate a parameter dependent on the loudness estimate; and control the first audio signal dependent on the parameter.

26 Claims, 8 Drawing Sheets

(56) References Cited

U.S. PATENT DOCUMENTS

| | | | |
|---|---|---|---|
| 7,676,362 B2* | 3/2010 | Boillot | G10L 19/26 704/205 |
| 8,090,120 B2* | 1/2012 | Seefeldt | H03G 3/32 381/104 |
| 8,229,106 B2* | 7/2012 | Greiss | G10L 21/0364 379/395 |
| 2004/0044525 A1 | 3/2004 | Vinton et al. | |
| 2005/0008165 A1* | 1/2005 | Sack | H04R 1/026 381/59 |
| 2006/0106472 A1 | 5/2006 | Romesburg et al. | |
| 2008/0056504 A1 | 3/2008 | Gorges et al. | |
| 2008/0177532 A1* | 7/2008 | Greiss | G10L 21/038 704/200.1 |
| 2010/0232626 A1* | 9/2010 | Paquier | H04S 1/007 381/119 |

FOREIGN PATENT DOCUMENTS

| | | |
|---|---|---|
| WO | 2008/078232 A1 | 7/2008 |
| WO | 2009/026143 A1 | 2/2009 |

OTHER PUBLICATIONS

International Search Report and Written Opinion received for corresponding Patent Cooperation Treaty Application No. PCT/IB2010/052113, dated Feb. 18, 2011, 14 pages.

* cited by examiner

METHOD AND APPARATUS FOR PROCESSING AN AUDIO SIGNAL BASED ON AN ESTIMATED LOUDNESS

RELATED APPLICATION

This application was originally filed as PCT Application No. PCT/IB2010/052113 filed May 12, 2010.

The present invention relates to apparatus for processing of audio signals. The invention further relates to, but is not limited to, apparatus for processing audio and speech signals in audio playback devices.

Audio processing and in particular audio processing in mobile devices have been a growing area in recent years.

The use of portable audio playback devices is therefore becoming common. It would be desirable that the loudness experienced by the user is constant or nearly constant independent of the source of the audio. For example it can be a common experience that speech audio during a phone call may have a significantly lower perceived loudness than a preceding music audio signal, which causes the user to increase the volume level in order to increase the loudness of the voice. However when the phone call ends and the user returns to listening to music with a higher loudness, this event can startle the user and require the user to reduce the volume.

In general this situation is not purely volume related but is perception based. A source signal can be perceived loud at a specific volume level whereas an alternative source signal can be perceived to cause less loudness at a same volume level. For example as well as the above voice and music switch different types of music file from their library can cause similar problems. In other words the user may change the volume level as the device switches between a classical music audio source, rock audio source, or pop audio source.

This invention thus proceeds from the consideration that by using a loudness model to estimate a perceived loudness of the signal gain or similar digital signal processing parameters may be adaptively adjusted.

Embodiments of the present invention aim to address the above problem.

There is provided according to a first aspect of the invention a method comprising: a method comprising: determining a loudness estimate of a first audio signal; generating a parameter dependent on the loudness estimate; and controlling the first audio signal dependent on the parameter.

Determining a loudness estimate may comprise applying at least one loudness model to the first audio signal;

The at least one loudness model may comprise at least one of: a digital filter; and a parametric filter.

The method may further comprise determining whether the first audio signal is speech, wherein the determining the loudness estimate of the first audio signal is dependent on the determination of whether the first audio signal is speech.

The at least one loudness model may comprise a speech loudness model to be applied to the first audio signal when the first audio signal is speech.

Determining the loudness estimate may further comprise applying an environmental model.

The environmental model may comprise at least one of: a loudspeaker model comprising at least one filter simulating the audio filtering of an integrated hands free loudspeaker; an earpiece model comprising at least one filter simulating the audio filtering of an earpiece transducer and housing; a headset model comprising at least one filter simulating the audio filtering of a predetermined headset; and a mechanical model comprising at least one filter simulating the mechanical acoustical response of the apparatus.

The method may further comprise smoothing the loudness estimate.

The parameter may comprise at least one of: a gain control parameter applied to an amplifier configured to control the first audio signal; a dynamic range parameter applied to a dynamic range processor configured to control the first audio signal; and a dynamic level parameter applied to a dynamic level controller configured to control the first audio signal.

Generating a parameter dependent on the loudness estimate may comprise: comparing the loudness estimate with a loudness input value; and generating the parameter dependent on the difference between the loudness estimate of the first audio signal and the loudness input value.

According to a second aspect of the application there is provided an apparatus comprising at least one processor and at least one memory including computer program code the at least one memory and the computer program code configured to, with the at least one processor, cause the apparatus at least to perform: determining a loudness estimate of a first audio signal; generating a parameter dependent on the loudness estimate; and controlling the first audio signal dependent on the parameter.

The apparatus caused to perform determining a loudness estimate may cause the apparatus to apply at least one loudness model to the first audio signal;

The at least one loudness model may comprise at least one of: a digital filter; and a parametric filter.

The apparatus may be further caused to perform determining whether the first audio signal is speech, wherein the determining the loudness estimate of the first audio signal is dependent on the determination of whether the first audio signal is speech.

The at least one loudness model may comprise a speech loudness model to be applied to the first audio signal when the first audio signal is speech.

The apparatus caused to perform determining the loudness estimate may be further caused to perform applying an environmental model.

The environmental model may comprise at least one of: a loudspeaker model comprising at least one filter simulating the audio filtering of an integrated hands free loudspeaker; an earpiece model comprising at least one filter simulating the audio filtering of an earpiece transducer and housing; a headset model comprising at least one filter simulating the audio filtering of a predetermined headset; and a mechanical model comprising at least one filter simulating the mechanical acoustical response of the apparatus.

The apparatus may be further caused to perform smoothing the loudness estimate.

The parameter may comprise at least one of: a gain control parameter applied to an amplifier configured to control the first audio signal; a dynamic range parameter applied to a dynamic range processor configured to control the first audio signal; and a dynamic level parameter applied to a dynamic level controller configured to control the first audio signal.

The apparatus caused to perform generating a parameter dependent on the loudness estimate may be further caused to perform: comparing the loudness estimate with a loudness input value; and generating the parameter dependent on the difference between the loudness estimate of the first audio signal and the loudness input value.

According to a third aspect of the invention there is provided an apparatus comprising: a loudness estimator configured to determine a loudness estimate of a first audio signal; a parameter generator configured to generate a parameter dependent on the loudness estimate; and a signal conditioner configured to control the first audio signal dependent on the parameter.

The loudness estimator may comprise a signal processor configured to apply at least one loudness model to the first audio signal;

The at least one loudness model may comprise at least one of: a digital filter; and a parametric filter.

The apparatus may further comprise a speech determiner configured to determine whether the first audio signal is speech, wherein the loudness estimator may be configured to estimate the loudness of the first audio signal dependent on the output of the speech determiner.

The loudness estimator may be configured to apply a speech loudness model to the first audio signal when speech determiner determiners the first audio signal is speech.

The loudness estimator may be configured to apply an environmental model to determine the loudness estimate.

The environmental model may comprise at least one of: a loudspeaker model comprising at least one filter simulating the audio filtering of an integrated hands free loudspeaker; an earpiece model comprising at least one filter simulating the audio filtering of an earpiece transducer and housing; a headset model comprising at least one filter simulating the audio filtering of a predetermined headset; and a mechanical model comprising at least one filter simulating the mechanical acoustical response of the apparatus.

The apparatus may further comprise a low pass filter configured to smooth the loudness estimate.

The parameter may comprise at least one of: a gain control parameter applied to an amplifier configured to control the first audio signal; a dynamic range parameter applied to a dynamic range processor configured to control the first audio signal; and a dynamic level parameter applied to a dynamic level controller configured to control the first audio signal.

The parameter generator may comprise: a loudness comparator configured to compare the loudness estimate with a loudness input value; and a parameter determiner configured to generate the parameter dependent on the difference between the loudness estimate of the first audio signal and the loudness input value.

The signal conditioner may comprise an amplifier; a dynamic range processor; and a dynamic level controller.

According to a fourth aspect of the invention there is provided an apparatus comprising: loudness estimator means configured to determine a loudness estimate of a first audio signal; parameter generator means configured to generate a parameter dependent on the loudness estimate; and signal conditioner means configured to control the first audio signal dependent on the parameter.

According to a fifth aspect of the invention there is provided a computer-readable medium encoded with instructions that, when executed by a computer perform: determining a loudness estimate of a first audio signal; generating a parameter dependent on the loudness estimate; and controlling the first audio signal dependent on the parameter.

An electronic device may comprise apparatus as described above.

A chipset may comprise apparatus as described above.

BRIEF DESCRIPTION OF DRAWINGS

For better understanding of the present invention, reference will now be made by way of example to the accompanying drawings in which.

Figure 1:
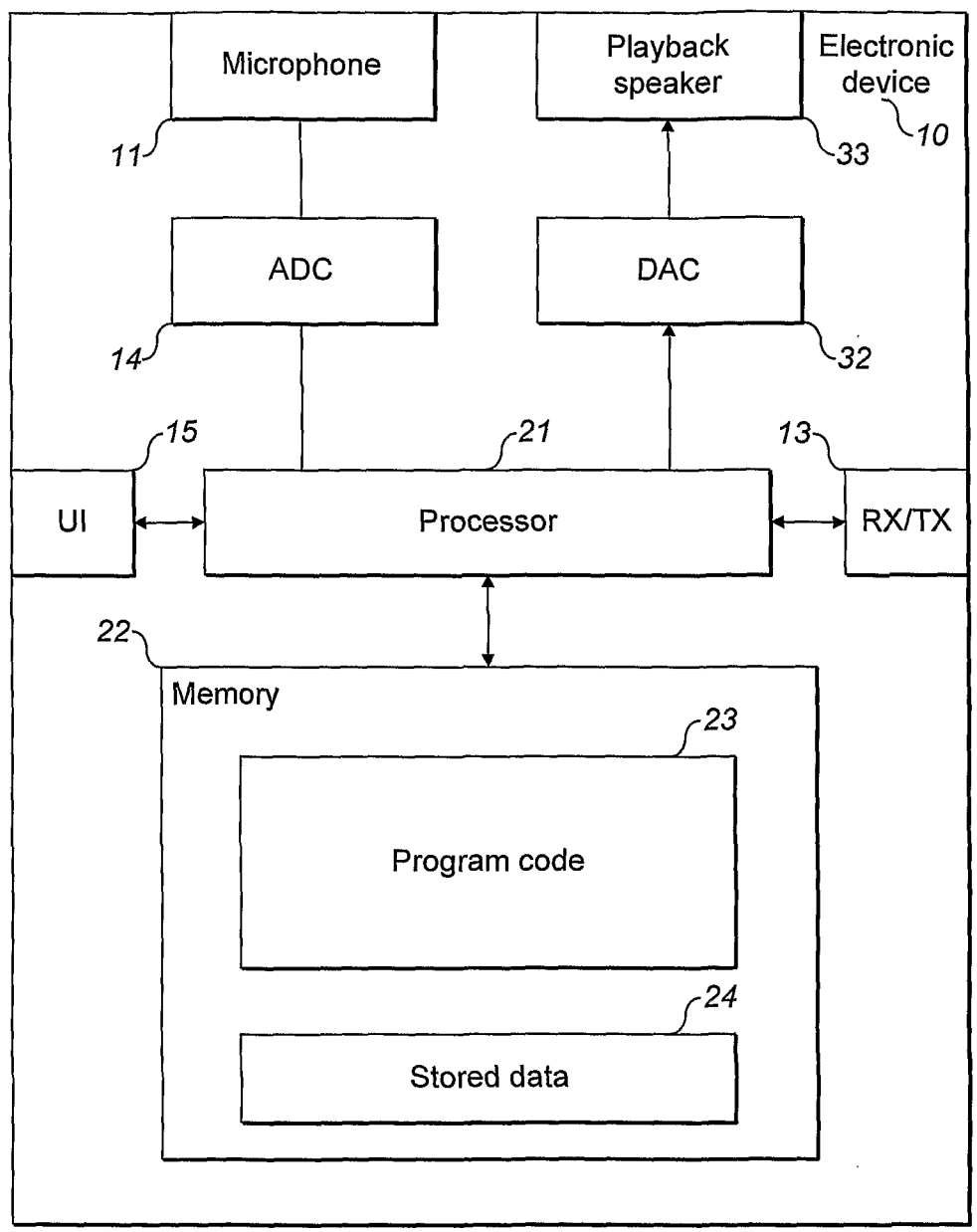
FIG. 1 shows schematically an apparatus employing embodiments of the application.

The following describes apparatus and methods for the provision of enhancing audio signal processing and playback. In this regard reference is first made to FIG. 1 which shows a schematic block diagram of an exemplary electronic device 10 or apparatus, which may incorporate playback apparatus according to some embodiments of the application.

The apparatus 10 may for example be a mobile terminal or user equipment for a wireless communication system. In other embodiments the electronic device may be a Television (TV) receiver, portable digital versatile disc (DVD) player, an audio player such as an mp3 player, or media player such as a mp4 player.

The apparatus 10 comprises a processor 21 which may be linked via a digital-to-analogue converter 32 to a playback speaker configured to provide a suitable audio playback. The playback speaker in some embodiments may be any suitable loudspeaker. In some other embodiments the playback speaker may be a headphone or ear worn speaker (EWS) set. In some embodiments the apparatus 10 may comprise a headphone connector for receiving a headphone or headset 33. The processor 21 is in some embodiments further linked to a transceiver (TX/RX) 13, to a user interface (UI) 15 and to a memory 22.

The processor 21 may be configured to execute various program codes. The implemented program codes comprise a loudness balancer for processing an audio signal and thus balance the loudness to the desired level. The implemented program codes 23 may be stored for example in the memory 22 for retrieval by the processor 21 whenever needed. The memory 22 could further provide a section 24 for storing data, for example data that has been processed in accordance with the embodiments.

The loudness balancing code may in embodiments be implemented in hardware or firmware. In the following example a schematic hardware implementation is described however it would be understood that various program codes, stored for example in memory 22, can also implement the loudness balancing operation.

The user interface 15 in some embodiments enables a user to input commands to the electronic device 10, for example via a keypad, and/or to obtain information from the electronic device 10, for example via a display. The transceiver 13 enables a communication with other electronic devices, for example via a wireless communication network.

It is to be understood again that the structure of the electronic device 10 could be supplemented and varied in many ways.

The apparatus 10 can in some embodiments further comprise at least one microphone 11 for monitoring audio or speech that is to be processed according to embodiments of the application. A corresponding application to capture audio signals using the microphone may be activated to this end by the user via the user interface 15. The apparatus 10 in such embodiments may further comprise an analogue-to-digital converter 14 configured to convert the input analogue audio signal into a digital audio signal and provide the digital audio signal to the processor 21.

The apparatus 10 may in some embodiments receive a bit stream with a correspondingly encoded audio data from another electronic device via the transceiver 13. In these embodiments, the processor 21 may execute the processing program code stored in the memory 22. The processor 21 in these embodiments may process the received audio signal data, and output the processed audio.

In some embodiments the headphone connector 33 may be configured to communicate to a headphone set or ear-plugs wirelessly, for example by a Bluetooth profile, or using a conventional wired connection.

The received stereo audio data may in some embodiments also be stored, instead of being processed immediately, in the data section 24 of the memory 22, for instance for enabling a later processing and presentation or forwarding to still another electronic device.

It would be appreciated that the schematic structures described in FIGS. 2 to 6 and the method steps shown in FIGS. 7 to 11 represent only a part of the operation of a complete audio processing chain comprising some embodiments as exemplary the shown implemented in the apparatus shown in FIG. 1.

Figure 2:
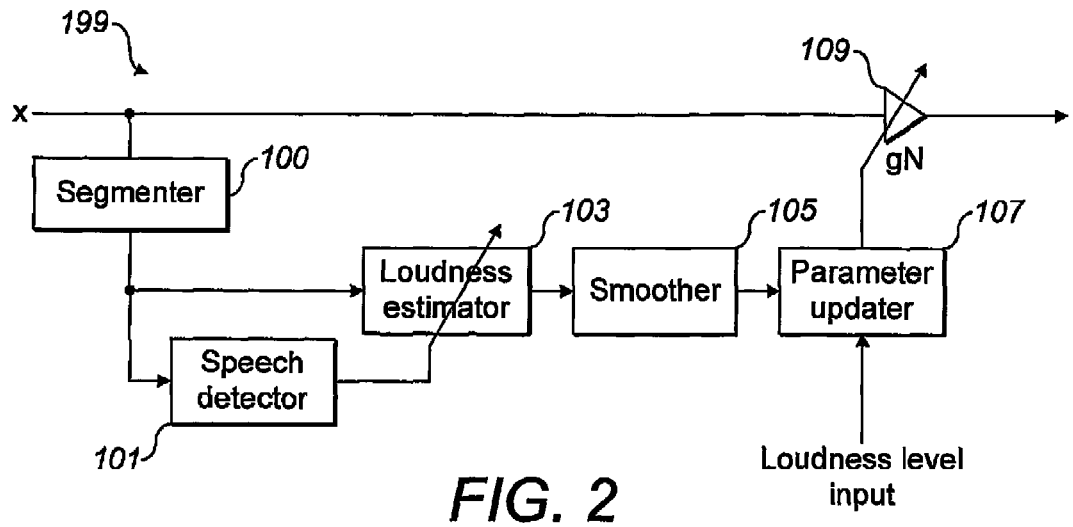
FIG. 2 shows schematically apparatus suitable for implementing some embodiments of the application.

With respect to FIG. 2, a schematic view of the loudness balancer 199. The following examples describe a single channel loudness balancer, however it would be appreciated that in other embodiments of the application, multiple channel balancers may be applied whereby each channel has its own balancer or a mixer used to generate a mixed channel for analysis to produce an overall balancing effect to be applied to each channel could be implemented.

In some embodiments of the application the loudness balancer 199 comprises a segmenter 100 configured to segment the received audio signals on one pathway, which may be called the analysis pathway, and a processing component on a second pathway, also known as the processing path or signal pathway. The input to the loudness balancer 199 is thus in these embodiments is passed to the segmenter 100 on the analysis pathway and also to a gain amplifier 109 on the signal pathway. It would be appreciated that in some embodiments the signal pathway may be any suitable processing of the signal required to be carried out. For example in some embodiments the signal pathway may comprise at least one of an analogue and digital processor suitable for processing the input signal and also configured to receive at least one control input from the analysis pathway.

The segmenter 100 receives the audio signal in a digital form and converts the audio signal into a sequence of windowed frames each of a specific length, period, or number of samples long. For example in some embodiments the segment/window generated by the segmenter 100 may have a 40 millisecond (ms) window length. Furthermore in some embodiments the segmenter 100 generates a segment (or frame or window) every 20 milliseconds. In other words a new segment is started after 20 milliseconds and each segment overlaps by 20 milliseconds with the previous segment and by 20 milliseconds with the next segment. It would be understood that any suitable window size and repetition may be used, for example in some further embodiments the window size may be from 20 to 50 milliseconds long and have a similar range of overlaps from 20 to 50 ms.

Figure 7:
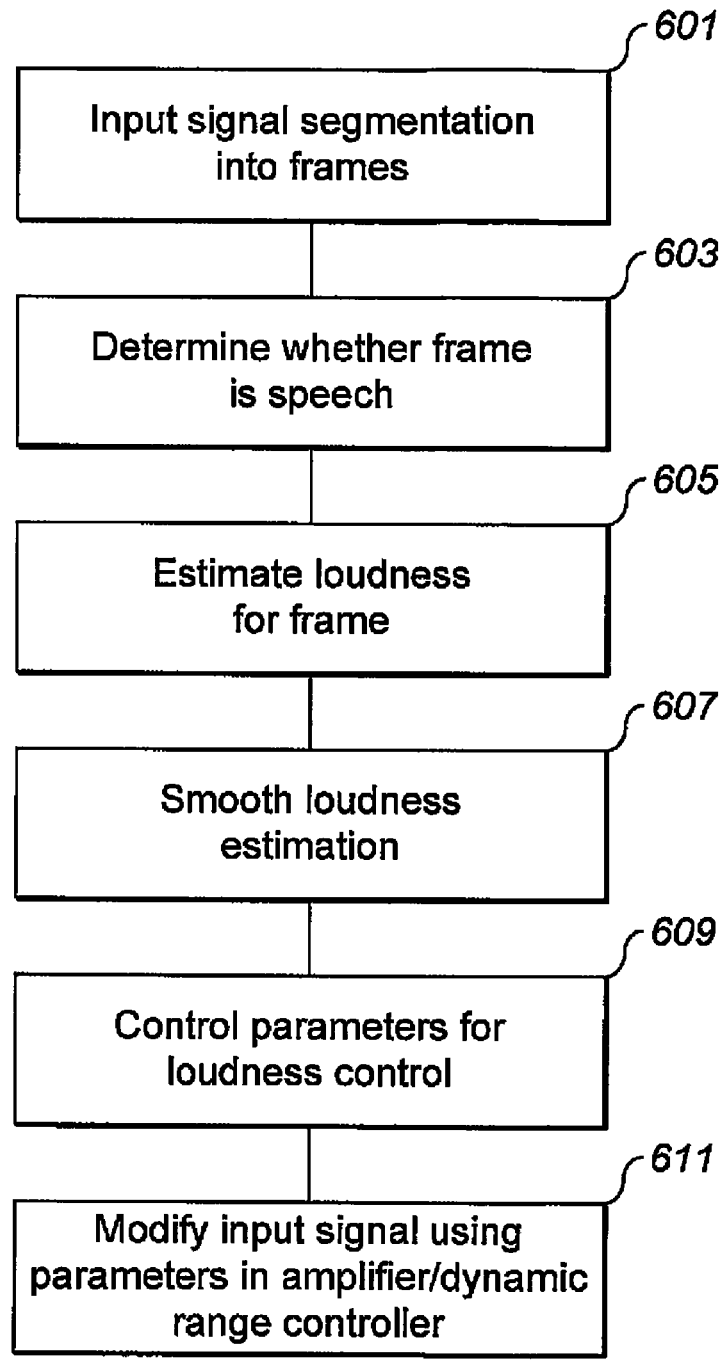
FIG. 7 shows a flow diagram showing the overview operation of some embodiments of the application.

The segmentation of the input signal into frames is shown in FIG. 7 by step 601. Each segmented frame may then be passed to the loudness estimator 103 and the speech detector 101.

In some embodiments the loudness balancer 199 further comprises a speech detector 101, which is configured to analyse the frames to determine if the frame if speech frame or a non-speech frame. In such embodiments the speech detector is configured to analyse the audio signal to determine when frames are speech and non-speech or silent. In some embodiments for example where the audio signal is a downlink signal (an example of which is a cellular or mobile call downlink to the apparatus) where speech may be present it is known that typical speech can be divided into speech frames comprising energy partials or formants where harmonic relations can be found and silent portions. Where a loudness estimate is to be generated according to some embodiments the loudness estimate is determined in relation to the speech frames and not the whole audio signal as the whole audio signal may provide a low estimate. In some embodiments the speech detector 101 is inactive or not present.

In some embodiments thus the speech detector 101 therefore receives the segmented frames from the segmenter 100 and is configured to determine whether each frame is a speech audio signal or a non-speech audio signal and pass the result of this determination to the loudness estimator 103. The operation of determining whether or not the frame is speech or non-speech is shown in FIG. 7 by step 603. It would be understood that in some embodiments that this operation would not be performed.

Figure 3:
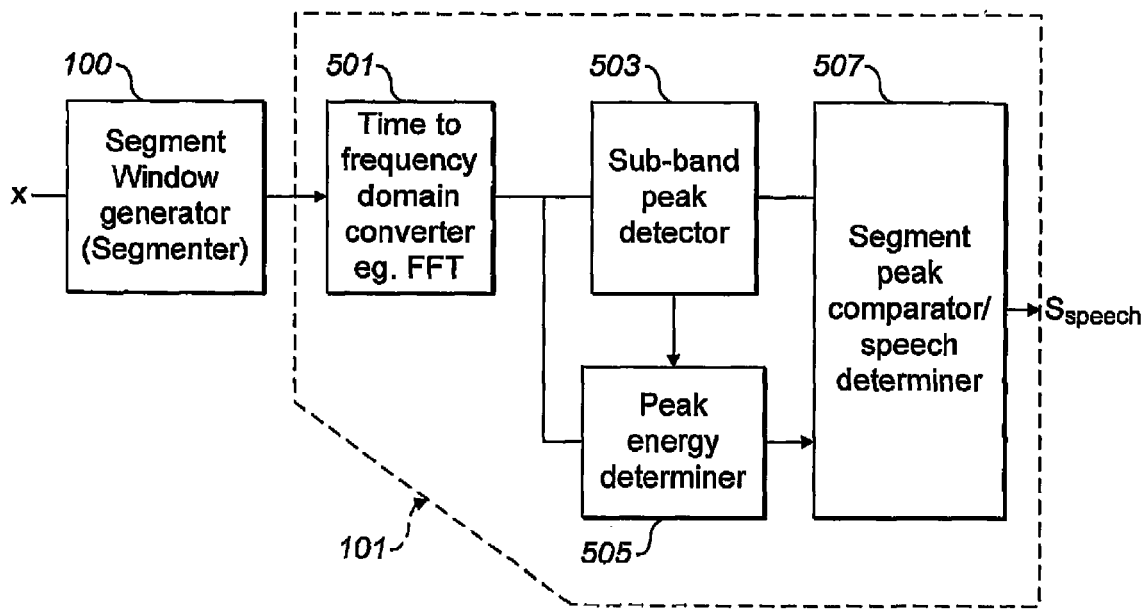
FIG. 3 shows schematically the loudness estimator as shown in FIG. 2 in further detail.

With respect to FIG. 3, a speech detector 101 according to some embodiments of the application is shown in further detail. Furthermore with respect to FIG. 8 the operation of the speech detector 101 according to embodiments of the application is shown in further detail.

The speech detector 101 in some embodiments comprises a time to frequency domain converter 501 which receives the frames from the segment window generator 100 and converts the time domain samples into frequency domain representations. The time to frequency domain converter 501 in some embodiments comprises any of a Fast Fourier Transformer, a modified Discrete Cosine Transformer (MDCT), a Wavelet Transformer, Discrete Fourier Transform, Short-Term Fast Fourier Transform (FFT), Goertzel's algorithm or any suitable time to frequency domain converter. In some embodiments the time to frequency domain converter 501 is configured to output only real frequency domain components whereas in other embodiments, both real and imaginary components may be output in order to preserve both amplitude and phase information. In some embodiments a zero padding operation can further be applied to improve the accuracy of the transform. The frequency domain components may then be output to the sub-band peak detector 503 and a peak energy determiner 505.

Figure 8:
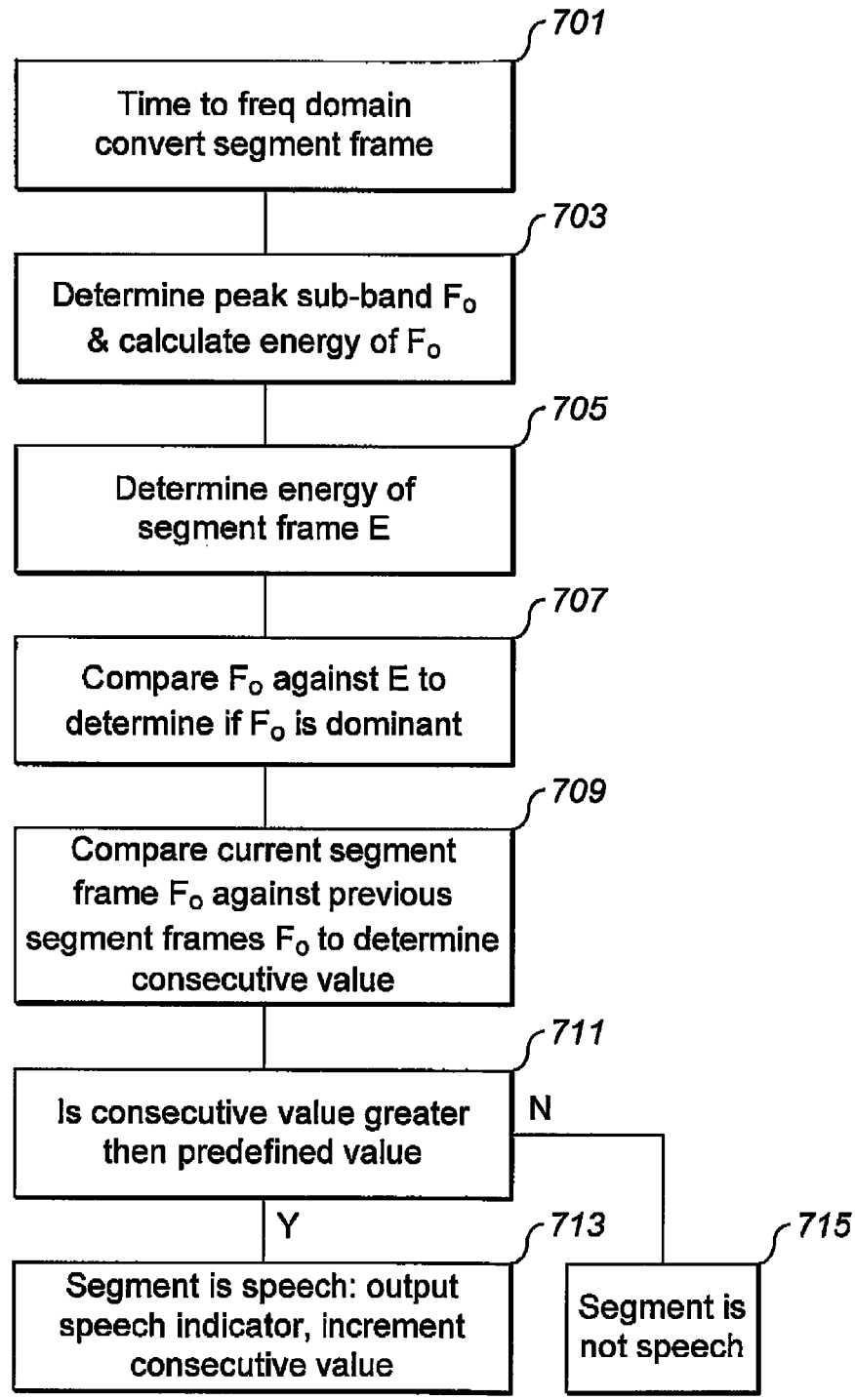
FIG. 8 shows a flow diagram showing the operation of the speech detector according to some embodiments of the application.

The generation of frequency domain components is shown in FIG. 8 by step 701.

In some embodiments the speech detector further comprises a sub-band peak detector 503. The sub-band peak detector 503 may be configured in some embodiments to compare the received frequency domain components (for example the N sub-bands output from the time to frequency domain converter 501) and output an indication or signals indicating the peak activity in the frequency domain components or sub-bands. The sub-band peak detector 503 in some embodiments determines a peak sub-band by determining the derivative of the sub-band coefficient value and choosing a sub-band as a peak sub-band where the derivative sign switches before and after the sub-band. For example the sub-bands may be processed to calculate the difference between neighbouring sub-bands and a sub-band selected as being a potential peak value if the sign of the difference between the current sub-band and the previous sub-band is different from the sign of the difference between the next sub-band and the current sub-band. In some embodiments only a predetermined number of sub-bands are selected to be passed to the peak comparator. These are the sub-bands with the N (where N is a predetermined number of sub-bands to be stored) highest energy sub-bands for the current segment or frame that has been determined to be peak sub-bands.

The peak indicator values may be passed in some embodiments to the segment peak comparator and to the peak energy determiner 505.

Furthermore in some embodiments the sub-band peak detector 503 calculates the energy of each of the peak sub-bands.

The determination of the peak sub-bands is shown in FIG. 8 by step 703.

In some embodiments the speech detector 101 further comprises a peak energy determiner 505.

The peak energy determiner 505 in some embodiments receives the peak sub-band indicator values representing frequencies where there is activity from the sub-band peak detector 503 and also the frequency domain components of the segment. The peak energy determiner 505 then calculates the ratio of energy at the detected peak or fundamental frequency and its harmonics compared to the total energy of the segment.

The determination of the peak sub-band energy is shown in FIG. 8 by step 705.

In some embodiments the speech detector 101 further comprises a peak energy determiner 505.

The segment peak comparator/speech determiner 507 receives in some embodiments both the indications of the peak sub-band activity and also the peak energy values from the sub-band peak detector 503 and ratio peak energy determiner 505 respectively and compares these values against previous frame segment peak values.

Furthermore in some embodiments the segment peak comparator 507 compares the peak values against the energy value for the frame to determine whether or not the peak value is a dominant sub-band value. The dominant sub-band peaks are then compared against the previous segment frames. The action of comparing the peaks against the total energy of the frame in order to determine dominant sub-bands is shown in FIG. 8 by step 707.

The segment peak comparator for example compares the current indicated peak values which are determined to be dominant against the previous M segment peak values to determine whether or not any of the current peak values is substantially similar to a previous peak sub-band value and/or how many previous peak sub-bands is it similar to.

The operation of comparing peak sub-band values against a range of previous peak sub-bands is shown in FIG. 8 by step 709.

Where a current segment peak value is similar to a range of previous segment peak sub-band values then this current segment peak value is selected as a potential fundamental frequency candidate and output to the fundamental frequency selector. In other words if each sub-band has an index value i then where at least one of the current segment peak value sub-band index values $\{i_t\}$ is within a range of $M_{range}$ of index values of previous segment peak values $\{i_{t-}\}$ then the sub-band index-either current or previous peak values is noted. In some embodiments the search range is split equally so that for each of the current sub-band peak values a range of previous peak values of $[i_t-M_{range}/2, i_t+M_{range}/2]$ is searched. This is because speech may have transient forms where the fundamental frequency slides over the same syllable. The operation of selecting substantially similar peak sub-bands over a range of segments may be implemented using a linked list memory where each element in the linked list comprises a sub-band index value and integer value representing the number of consecutive segments the sub-band has been "active" for. In such embodiments for each segment the segment peak comparator 507 compares the current "active" or peak sub-band index value against the list. If a current peak sub-band index is outside the search range then the list is incremented by an additional element with the current peak sub-band index and a consecutive segment value of 1. If the current peak sub-band index is within the search range then the list entries within the search range are amended so that there sub-band index value is the current index value and the consecutive segment value incremented by 1. In such embodiments where 2 or more search range generates more than one match, then the entry with the largest consecutive index is chosen. Finally the list is then pruned to remove all entries which have not been updated or added in the current segment.

In some embodiments other suitable search and memory operations may be used to monitor consecutive segment sub-bands. Thus the list contains a series of entries of frequency indicators and the number of consecutive segments within which the frequency has been a "peak" value.

The segment peak comparator/speech determiner 507 may in some embodiments output a binary decision of whether or not there are any speech components within the segment where the number of active consecutive sub-bands is within the predefined range of values. For example in some embodiments the range of values is defined as being equal to or greater than a predefined value. For example in some embodiments the segment peak comparator speech determiner 507 may determine that speech has been detected where there is at least one peak sub-band over two consecutive segments. In such embodiments the speech determiner 507 can output a binary decision $S_{speech}$ of 1.

The operation of comparing the current segment frame against previous segment frames to determine consecutive values is shown in FIG. 8 by step 709.

In some other embodiments the predefined range is defined by a predefined lower and upper level, in other words that the number of consecutive "active" segments for a sub-band is between a minimum number and a maximum number.

The operation of determining whether or not the consecutive value is greater than the predefined value is shown in FIG. 8 by step 711.

Furthermore step 713 shows that when the segment is determined as being speech, a speech indicator is output. For example $S_{speech}$ is set to a value of 1.

Within step 715 where the consecutive value is not greater than the predefined value according to the comparison step of 711 then the then a non-speech indicator is output. For example $S_{speech}$ is set to a value of 0.

It would be appreciated that speech/non-speech detection in some embodiments can be carried out in any other suitable manner. In some embodiments for example all fundamental frequencies within a defined range (defined by the typical speech signal fundamental frequencies) are monitored, in other words the dominant sub-bands over a specific frequency range only are used.

It would also be understood that it would be possible for in some embodiments the speech detector 101 to estimate the fundamental frequency and check whether or not it lies within an expected range of speech frequencies. As has been indicated previously the output of the speech detector 101 may in some embodiments be passed to the loudness estimator 103 to control the loudness estimator in such a way that the loudness estimator is configured only to generate a loudness estimate for a frame when the frame is determined to be speech but not when the frame is determined to be non-speech or silence in order that the loudness estimate does not inaccurately bias any averaging of the loudness estimate with 'silence' loudness estimates.

In some embodiments the loudness balancer 199 further comprises a loudness estimator 103.

The segmented frame data is received by the loudness estimator 103. In some embodiments, as described above such as the call downlink embodiment, the loudness estimator 103 may also receive a speech/non-speech indicator indicating whether or not the current segment/frame is speech or non-speech. As described above in such embodiments where the loudness estimator 103 receives a speech/non-speech indicator the loudness estimator may be configured to only produce a loudness estimate for a frame where the speech/non-speech indicator has a speech indication value.

In some embodiments the loudness estimator 103 receives a further indicator which has a value representing the environment within which the apparatus is operating. For example in some embodiments the loudness estimator 103 receives an input indicating whether or not the device is being used with headphones, for example Bluetooth headphones or wired connection headphones, in a hands-free mode and thus using the integrated hands-free loudspeaker, or being used close to the user's ear using the earpiece loudspeaker within the apparatus. In some embodiments this indicator/indicator value is determined by the loudness estimator 103, for example the loudness estimator may perform a headphone/headset determination operation determining if a headphone/headset is connected to the apparatus and in some embodiments what type or model the headphone/headset is. Furthermore the loudness estimator 103 in some embodiments may determine whether the apparatus is being used in hands free or earpiece mode from the apparatus proximity detector.

The loudness estimator 103 having received the segment frame is configured to estimate a loudness value of the segment/frame within at least one environment. The loudness estimator 103 as described above in some embodiments receives a input indicating which specific mode or environment the loudness estimate is to be determined for.

In some embodiments the loudness estimator 103 produces a loudness estimate value for more than one environmental situation or mode. In some of these embodiments each of the loudness estimates are output, whereas in some other embodiments the loudness estimator further comprises a switch 202 which enables the loudness estimator 103 to enable a specific pathway and output one loudness estimate associated with the environment/mode of operation.

The operation of generating at least one loudness estimate for the segment frame is shown with regards to FIG. 7 by step 605.

Figure 4:
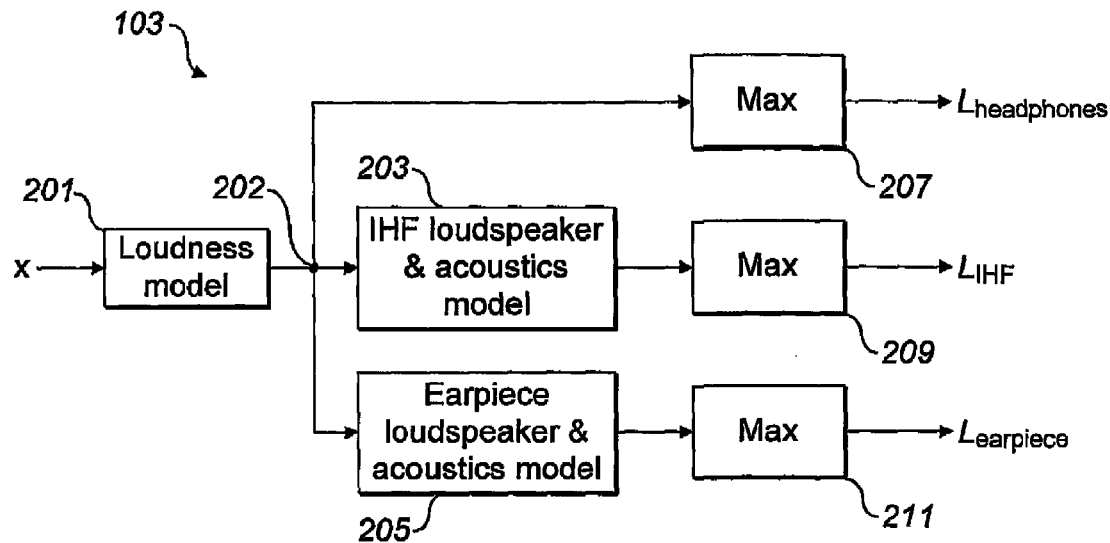
FIG. 4 shows schematically some further apparatus suitable for implementing some embodiments of the application.
Figure 9:
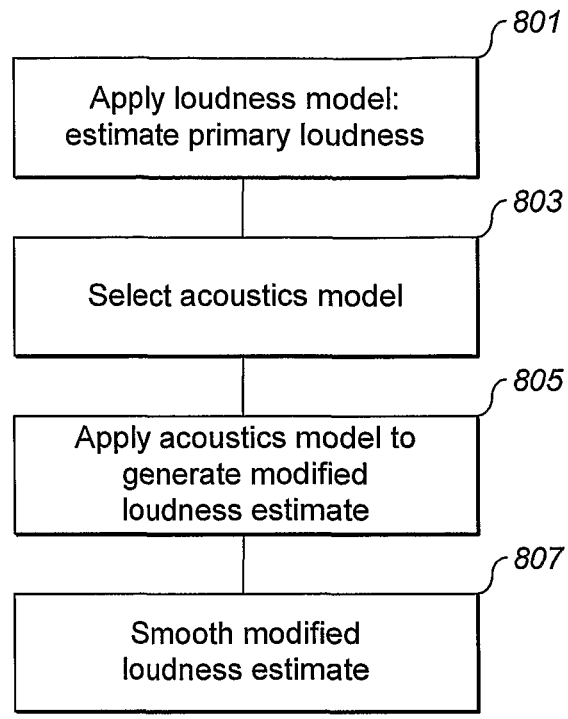
FIG. 9 shows a flow diagram showing the operation of the loudness estimator according to some embodiments of the application.

With respect to FIG. 4 which shows a loudness estimator 103 in further detail and FIG. 9 which shows the operation of such a loudness estimator, the structure and operation of a loudness estimator 103 according to some embodiments is further described and explained. In the following discussion of some of the embodiments of the application the loudness estimator 103 comprises a loudness module processor 201 which outputs a primary estimate of the loudness which may be passed to a switch to select one of three displayed environmental/mode estimate modifiers. It would be appreciated that in some embodiments the loudness estimator 103 in some embodiments does not comprise a switch and thus as described above can determine and output more than one loudness estimate where each loudness estimate is dependent on the environmental condition/mode of operation of the apparatus.

The loudness estimator 103 thus in some embodiments comprises a loudness module processor 201. The loudness model processor 201 according to some embodiments simulates the properties of the human auditory system. In some embodiments the loudness model processor 201 comprises a filter or set of filters which correspond to a selected Equal-Loudness-Curve (ELC) and a mapping from signal energy to loudness. In some embodiments the loudness model processor 201 can apply a known loudness model, for example the, or any suitable loudness model.

It would be understood that in some embodiments the loudness model processor 201 can select one from any number of potential model forms such as the Zwicker loudness model discussed in Launer's dissertation (http://medi.uni-oldenburg.de/download/docs/diss/Launer_1995_LoudnessPerception/appendix.pdf).

In some embodiments the loudness model processor 201 can select a common loudness model to apply to the input data according to the processing capability or capacity of the apparatus 10.

The application of the loudness model and the estimation of the primary loudness characteristic or value is shown in FIG. 9 by step 801.

In some embodiments the loudness estimator comprises a switch 202. The primary loudness estimate in such embodiments is output to the switch 202 which can in some embodiments can output the primary loudness estimate to at least one of the 'mode' or 'environment modifier' pathways dependent on the environmental conditions the apparatus is operating in or the mode of the operation of the apparatus. For example in some embodiments the switch 202 can output the primary loudness estimate to at least one acoustic modification models to process and modify the primary loudness value to determine a condition or mode modified loudness estimate for the audio frame. For example in some embodiments the modes of operation or 'environmental conditions' can be 'headphone connection', 'hands-free connection', or 'earpiece connection' and used to indicate how the apparatus is being used.

In other words the apparatus may have the capacity to receive headphones, have the capacity to generate the audio output using an internal hands free loudspeaker, or be capable of outputting the audio signal via an earpiece loudspeaker.

The selection of one of the acoustics models is shown in FIG. 9 by step 803.

In such embodiments the switch 202 can output the loudness primary estimate to the headphone pathway. The headphone pathway comprises a maximiser 207 which monitors and stores a temporary maximum value before outputting the value on the headphones output ($L_{headphones}$).

Figure 5:
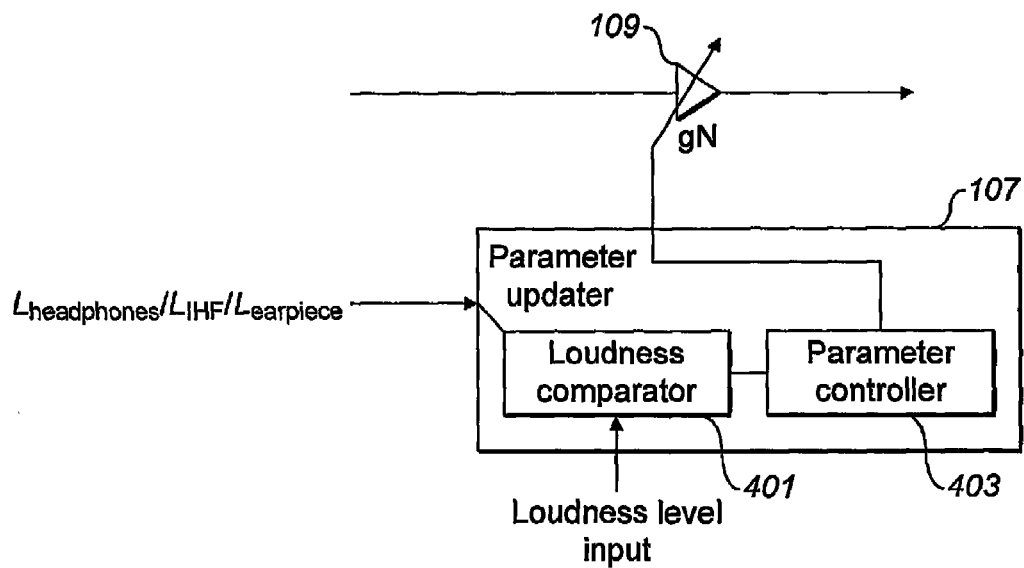
FIG. 5 shows a parameter updater as shown in FIGS. 2 and 4 in further detail.

In some embodiments, for example those where a loudness estimate is pre-determined or pre-calculated and used later the loudness estimates can be determined and then the maximiser 207 output a maximum value for the file or audio track which can then be stored in memory. In these embodiments when the same track/file is played the pre-calculated value can be retrieved from memory and input to the parameter updater, for example the parameter updated as shown in FIG. 5 and described in further detail later.

In some embodiments, for example those embodiments where the loudness estimate is determined when the file/track is to be played or while being played, the pathways do not comprise maximisers to monitor a maximum value for the track/file and can in some embodiments be passed to the smoother as shown in FIG. 2 and described also in further detail later.

In some embodiments the apparatus can on detecting a headphone set interacting with the apparatus cause the switch to select the headphone pathway to receive the loudness primary estimate.

In some embodiments the apparatus can further determine the type or model of the headphone interacting with the apparatus and can in these embodiments further modify the loudness estimate before the maximiser 207 to simulate the acoustic effect of the type or model of the apparatus being operated.

Furthermore in some embodiments the switch 202 can select the second pathway, the integrated hands free loudspeaker acoustics model pathway on determining that the apparatus is operating in a hands free mode using the integrated hands free loudspeaker. In such embodiments the loudspeaker and acoustics model pathway comprises an IHF loudspeaker and acoustics model 203 which can be a filter which simulates the acoustic effect of the IHF loudspeaker characteristics and the acoustical properties of the IHF surroundings. The output of the IHF loudspeaker and acoustics model 203 filter can then be output to a IHF pathway maximiser 209 which stores a temporary maximum value of the loudness value and outputs this on a loudness IHF ($L_{IHF}$) output.

Furthermore in some embodiments the switch outputs the primary loudness value received from the loudness model processor 201 to an earpiece loudspeaker and acoustics model pathway on determining that the apparatus is operating using the integrated earpiece. The earpiece loudspeaker and acoustics model pathway in such embodiments can comprise an earpiece loudspeaker and acoustics model processor 205 which can be a filter simulating the acoustical effect of the earpiece loudspeaker. The output of the earpiece loudspeaker and acoustics model 205 filter can be output to a third maximiser 211 which stores a temporary maximum value before outputting on a earpiece loudness ($L_{earpiece}$) output.

The application of an acoustics model to generate a modified loudness estimate is shown in FIG. 9 by step 805. However it would be appreciated that in some embodiments the acoustics model may be a 'null' effect. In other words the loudness estimate modification acoustic model may output the same loudness estimate value as was input.

In some embodiments as described above the switch 202 is configured to output the loudness model output to more than one pathway and then at least one output of all the pathways as selected to be output.

In some embodiments the loudness balancer 199 further comprises a smoother 105. The smoother in such embodiments attempts to prevent sudden changes in the gain changes by smoothing the loudness estimates which can vary significantly within a single track and cause over reactive changes in the later parameter determination. In some embodiments the smoother 105 can comprise a low pass filter which receives at least one of the loudness estimates and smoothes the segment by segment loudness estimation values. In such embodiments the loudness estimates missing for example when a silence or non-speech frame is determined in downlink communication examples can be allowed for. The smoothing of the modified loudness estimates as shown in FIG. 9 as step 807.

Furthermore the smoothing of the loudness estimation is shown in FIG. 7 by step 607.

In some embodiments the balancer further comprises a parameter updater 107. The parameter updater 107 receives the smoothed loudness estimation values and furthermore receives a target loudness level input which may be selected by the user, for example may be selected by the user by the use of a 'volume' input or setting. In some other embodiments the target loudness level input can be set either automatically or semi-automatically. In some embodiments the target loudness level input can be generated by the user interface of the apparatus (entered manually or semi-automatically from a range of values). The parameter updater 107 furthermore is configured to generate a parameter for the signal pathway which may be used to control the processing of the audio signal. For example the processing parameter may be a gain or dynamic level controller parameter. The controlling/determination of at least one parameter for loudness control is shown in FIG. 7 by step 609.

Furthermore with respect to FIG. 5 a parameter updater 107 according to some embodiments of the application is shown in further detail. Furthermore with respect to FIG. 10 the operation of such a parameter updater 107 is shown in further detail. In some embodiments the parameter updater 107 comprises a loudness comparator 401 configured to compare the loudness estimates and target loudness level input and a parameter controller 403 configured to generate control signals dependent on the output from the loudness comparator 401.

The loudness estimates from the smoother 105, in other words the smoothed $L_{headphones}/L_{IHF}/L_{earpiece}$ values, are passed in some embodiments to the loudness comparator 401. Furthermore the loudness comparator 401 in such embodiments receives the target loudness level input. The loudness comparator 401 in such embodiments compares the smoothed estimated loudness value and the target loudness level input to determine an indicator or error value which can be output to the parameter controller 403. In some embodiments the loudness comparator 401 generates an expected difference between the target loudness level input and the smoothed estimated loudness estimate which is passed to the parameter controller 403.

Figure 10:
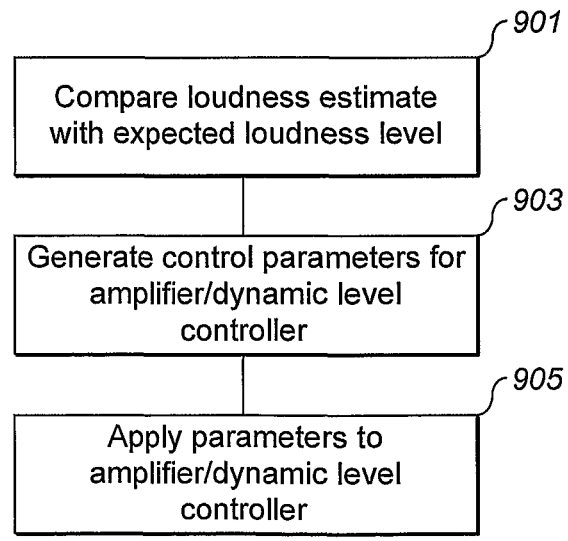
FIG. 10 shows a flow diagram showing the operation of the parameter updater according to some embodiments of the application.

The comparison between the smoothed estimated loudness value with the target loudness level input is shown in FIG. 10 by step 901.

Furthermore as described above in some embodiments the parameter updater 107 further comprises the parameter controller 403 configured to receive the output of the loudness comparator 401 and further configured to generate a parameter value to control at least part of the signal pathway. In the above examples the control of the signal pathway is shown by the passing of a control parameter to an amplifier 109, however as previously discussed the signal pathway processing element can be any suitable processing of the audio signal of which gain values may be manipulated. For example in some embodiments a dynamic level controller (DLC) or dynamic range controller (DRC) can be implemented to control the audio signal.

The parameter controller 403 in some embodiments can generate the control parameters in some embodiments by using a look-up table which outputs a gain parameter dependent on the error value such that the gain is increased when the target loudness level input is greater than the smoothed estimated loudness value but decreases the gain value when the target loudness level input is less than the smoothed estimated loudness value.

Generation of at least one control parameter for the signal pathway processing is shown in FIG. 10 by step 903.

Furthermore with respect to the summary operation FIG. 7 the application of at least one control parameter for loudness control is shown in FIG. 7 by step 609.

In some embodiments, as discussed above, the loudness balancer 199 can be considered to comprise an amplifier 109 in the signal pathway. The amplifier 109 in such embodiments receives the audio signal and the gain parameter from the parameter updater 107 and amplifies the audio signal dependent on the gain parameter such that when the smoothed estimate loudness value is below the target loudness level input, the amplification is increased to balance the level of the loudness. Similarly in such embodiments the amplifier 109 is configured to decrease the amplification when the smoothed estimate loudness value is above the target loudness level input.

The application of the at least one control parameter to the amplifier/dynamic level controller is shown in FIG. 10 by step 905.

Furthermore the operation of modifying the input audio signal using the at least one control parameter is shown in FIG. 7 by step 611.

Therefore in embodiments such as described above, once the loudness estimation has been calculated the audio signal processing (such as a dynamic range controller (DRC) or dynamic level controller (DLC) or an amplifier) may be adaptively adjusted to produce a consistent perceived loudness for the user relevant to the target loudness requested by the user. Thus where the loudness model identifies a severe reduction or increase of loudness values as compared to a default setting for an audio track the loudness balancer 199 can update parameters, which in some embodiments may be software parameters, such as dynamic range controller values or gain values. For example the dynamic range controller can in some embodiments be tuned in light of a particular test signal where the characteristics of a test signal could be compared against a source signal such as a music track.

In some embodiments this comparison could be a threshold detection. Furthermore in some embodiments the system could calculate loudness estimates for all types of signals (music tracks) as soon as they are placed in the music library in advance and therefore the parameters could be updated as soon as the user selects playing the music track from the library.

In some other embodiments the playback system in the apparatus uses a short silent portion, for example the 2 or 3 seconds between each music track, and during the silent portion the system calculates the loudness estimate and decides whether the DSP parameters or amplifier values require updating and if so updates the DSP parameters or amplification value in order that the loudness level produced is consistent with the expected or required loudness value.

In some other embodiments in order to reduce the effect of the additional break between tracks where predefined values are not available in some embodiments the analysis can be carried out in real time with a very slow smoothing filter applied. Furthermore in such embodiments as the track or audio file is being played for the first time the determined loudness estimate values may be determined and stored for future plays of the same track or audio file.

In some embodiments the determination of the new gain value or DSP parameters generated by the parameter updater uses an adaptive algorithm such that the error term produced by the comparator between the target and estimated loudness levels changes with step size depending on the percentage or value of the error value compared to the target value.

Furthermore in some embodiments where the signal path uses a dynamic range controller the parameter updater 107 can control the dynamic range control parameters such as the compression ratio. In such embodiments the signal path can further comprise a loudness normalisation gain operation. In some embodiments the audio loudness balancing can be further improved by introducing pre-processing of the audio tracks or files. For example in some embodiments audio visual files, such as music and videos which are stored in the apparatus' internal memory comprise a pre-processor configured to determine a single loudness value for the specific file or track and can store this single value in memory associated with the audio track or file. In such embodiments the single loudness value can be the peak loudness value within the file which is stored onto a database and the specific track or file. Furthermore in such embodiments the parameter updater 107 can receive the pre-processed loudness value corresponding to the track to be played. This pre-processed value in some embodiments may then be modified according to the mode of operation/environmental conditions of the apparatus. In some embodiments more than one loudness value can be determined stored and used, for example the pre-processor in some embodiments can be configured to determine loudness values for the file/track associated with IHF, earpiece and headphone loudness values, These values can then in these embodiments be stored for each track in order that the level may be adjusted according to the environment within which the track is being played.

In some embodiments a further feedback loop may be implemented in order to improve the loudness balancing. With respect to FIG. 6 and FIG. 11, apparatus according to these embodiments and additional operations of these embodiments compared with the embodiments described previously is shown in further detail.

Figure 6:
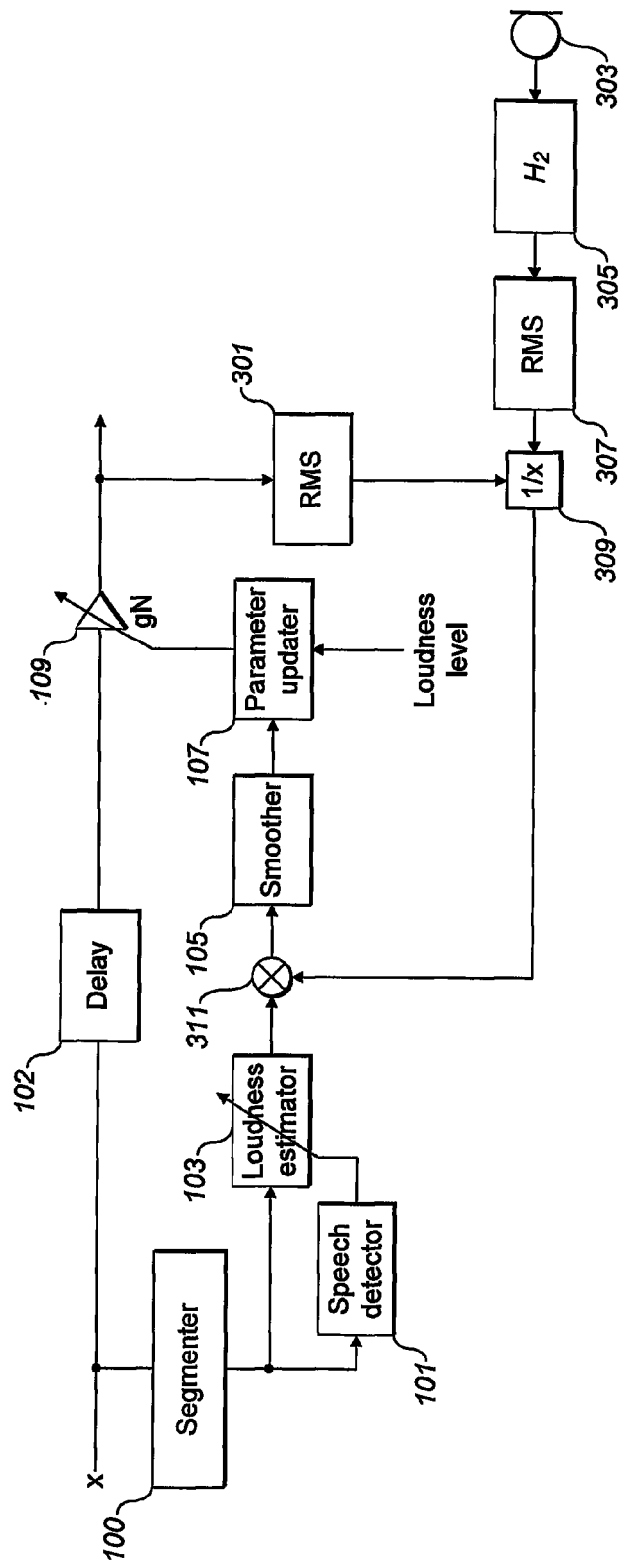
FIG. 6 shows a speech detector as shown in FIGS. 2 and 4 in further detail.

The example apparatus shown in FIG. 6 is similar to the example apparatus shown in FIG. 2 but further comprises a feedback loop used to assist controlling the loudness balancing operation. It would be appreciated that the feedback loop described hereafter may be implemented in combination with any of the previously described embodiments and not only with the example apparatus shown in FIG. 2 and described previously.

The loudness balancer in FIG. 6 further comprises a microphone 303 which is configured to receive audio input from the environment. In some embodiments the microphone 303 is configured to output a digital format signal, and thus may be an integrated filter comprising an analogue to digital converter of a suitable type. In some other embodiments the microphone is configured to output an analogue signal to a suitable analogue-to-digital converter (ADC) the output of which is then further processed according to the following description.

Figure 11:
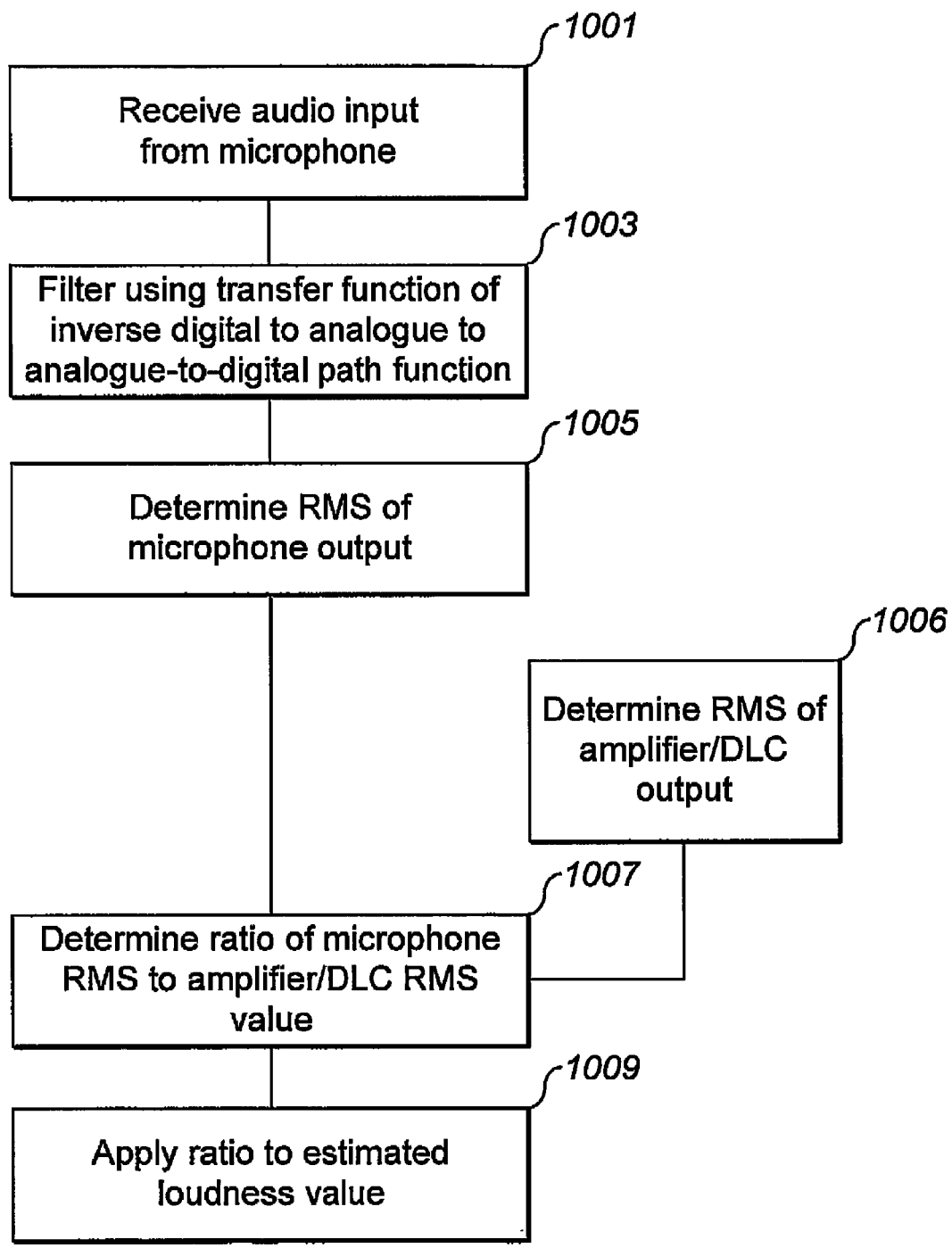
FIG. 11 shows a flow diagram showing the operation of a feedback loop shown in the further apparatus as shown in FIG. 4.

The operation of receiving the audio input by the microphone is shown in FIG. 11 by step 1001.

Furthermore the loudness balancer further comprises in these embodiments a filter 305 configured to filter the microphone signal using a transfer function representing the inverse of the path from the digital-to-analogue converter (DAC) to the analogue-to-digital converter (ADC) path function. In other words the filter is configured to attempt to remove any biasing caused by the digital-to-analogue conversion following the amplifier 109, the microphone analogue-to-digital conversion described above, and also allow for any acoustic effect of the loudspeaker and the mechanical arrangement of the loudspeaker. The output of the filter 305 is passed to a microphone root mean square (RMS) processor 307.

The filtering of the microphone signal is shown in FIG. 11 by step 1003.

The loudness balancer further in these embodiments comprises a microphone RMS processor 307 configured to receive the output of the filter 305, perform a root mean square operation on the filtered microphone signal, and output the root mean squared microphone value to a ratio processor 309. The root mean square (RMS) value may be calculated using any suitable root mean square process.

The determination of the root mean square of the microphone output is shown in FIG. 11 by step 1005.

The loudness balancer in these embodiments further comprises a audio signal RMS processor 301 configured to receive the output of the signal path, which is in this example represented by the amplifier 109, perform a root mean square operation on the audio signal output by the signal path, and output the root mean squared audio signal value to the ratio processor 309.

The determination of the root mean square of the signal pathway (amplifier/dynamic level dynamic range controller) output is shown in FIG. 11 by step 1006.

The loudness balancer in these embodiments further comprises a ratio combiner which is configured to output a ratio of the two received RMS values to a multiplier 311.

The operation of determining the ratio of the microphone RMS to the signal pathway RMS value is shown in FIG. 11 by step 1007.

The ratio thus can be considered to be a determination of the actual loudness or the loudness experienced by the microphone against the output loudness values passed to the transducer.

In some embodiments the loudness balancer further comprises a multiplier 311.

The multiplier 311 in these embodiments is configured to receive the output of the loudness estimate and the ratio combiner, generate a product of the estimated loudness and ratio and pass the multiplied loudness estimate to the smoother 105 which smoothes the value as described above. In other words the feedback loop attempts to compensate for the loudness estimation model against any bias in the loudness estimation. The operation of generating the product of the ratio to the estimated loudness value is shown in FIG. 11 by step 1009.

Although we have described the operation of the analyser as being carried out with regards to the frequency domain, it would be understood a time domain implementation where sub-band time domain filtering and integration may be carried out in order to produce similar output results.

In some embodiments the loudness balancer 199 can further comprise a playback compensator. The playback compensator can in these embodiments be configured to allow for or compensate for the any processing effect on the processing path or signal pathway which affects the loudness estimation other than the parameter control affects. Thus for example where the processing effect was one of a spectral processing or equalization the parameters of the various spectral gains could be passed to the loudness balancer playback compensator to determine the effect of the processing on the loudness estimation for the track/file being analysed and played.

Thus in summary at least one embodiment of the application performs a method comprising: determining a loudness estimate of a first audio signal; generating a parameter dependent on the loudness estimate; and controlling the first audio signal dependent on the parameter.

Although the above examples describe embodiments of the invention operating within an electronic device 10 or apparatus, it would be appreciated that the invention as described below may be implemented as part of any audio processor. Thus, for example, embodiments of the invention may be implemented in an audio processor which may implement audio processing over fixed or wired communication paths.

Thus user equipment may comprise an audio processor such as those described in embodiments of the invention above.

It shall be appreciated that the term electronic device and user equipment is intended to cover any suitable type of wireless user equipment, such as mobile telephones, portable data processing devices or portable web browsers.

In general, the various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

Thus at least some embodiments may be an apparatus comprising at least one processor and at least one memory including computer program code the at least one memory and the computer program code configured to, with the at least one processor, cause the apparatus at least to perform: determining a loudness estimate of a first audio signal; generating a parameter dependent on the loudness estimate; and controlling the first audio signal dependent on the parameter.

The embodiments of this invention may be implemented by computer software executable by a data processor of the mobile device, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions. The software may be stored on such physical media as memory chips, or memory blocks implemented within the processor, magnetic media such as hard disk or floppy disks, and optical media such as for example DVD and the data variants thereof, CD.

Thus at least some embodiments may be a computer-readable medium encoded with instructions that, when executed by a computer perform: determining a loudness estimate of a first audio signal; generating a parameter dependent on the loudness estimate; and controlling the first audio signal dependent on the parameter.

The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

As used in this application, the term 'circuitry' refers to all of the following:
(a) hardware-only circuit implementations (such as implementations in only analog and/or digital circuitry) and
(b) to combinations of circuits and software (and/or firmware), such as: (i) to a combination of processor(s) or (ii) to portions of processor(s)/software (including digital signal processor(s)), software, and memory(ies) that work together to cause an apparatus, such as a mobile phone or server, to perform various functions and
(c) to circuits, such as a microprocessor(s) or a portion of a microprocessor(s), that require software or firmware for operation, even if the software or firmware is not physically present.

This definition of 'circuitry' applies to all uses of this term in this application, including any claims. As a further example, as used in this application, the term 'circuitry' would also cover an implementation of merely a processor (or multiple processors) or portion of a processor and its (or their) accompanying software and/or firmware. The term 'circuitry' would also cover, for example and if applicable to the particular claim element, a baseband integrated circuit or applications processor integrated circuit for a mobile phone or similar integrated circuit in server, a cellular network device, or other network device.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. A method for processing audio and speech signals comprising:
   receiving an indication for a mode of operation of an apparatus;
   receiving a first audio signal during the mode of operation;
   determining a target loudness level for playback of at least one of audio and speech signals based on the mode of operation;
   determining whether the first audio signal comprises speech or non-speech frames wherein said non-speech frames comprise silence or audio portions;
   determining a loudness estimate, wherein the loudness estimate is generated for at least one frame when the at least one frame is determined to be speech and the loudness estimate is generated differently for the at least one frame when the at least one frame is determined to be a non-speech signal during the mode of operation;
   generating at least one signal processing parameter dependent on the loudness estimate when the at least one frame is the at least one of audio and speech signals during the mode of operation; and
   adjusting the first audio signal with the at least one signal processing parameter relative to the target loudness level.

2. The method as claimed in claim 1, wherein determining a loudness estimate comprises applying at least one loudness model to the first audio signal.

3. The method as claimed in claim 2, wherein the at least one loudness model comprises at least one of:
   a digital filter; and
   a parametric filter.

4. The method as claimed in claim 2, wherein the at least one loudness model comprises a speech loudness model to be applied to the first audio signal when the first audio signal comprises a speech frame.

5. The method as claimed in claim 2, wherein the at least one loudness model stimulates properties of a human auditory system.

6. The method as claimed in claim 1, wherein determining the loudness estimate further comprises applying an environmental model.

7. The method as claimed in claim 6, wherein the environmental model comprises at least one of:
   a loudspeaker model comprising at least one filter simulating the audio filtering of an integrated hands free loudspeaker;

an earpiece model comprising at least one filter simulating the audio filtering of an earpiece transducer and housing;
a headset model comprising at least one filter simulating the audio filtering of a predetermined headset; and
a mechanical model comprising at least one filter simulating the mechanical acoustical response of the apparatus.

8. The method as claimed in claim 1, wherein the at least one signal processing parameter comprises at least one of:
a gain control parameter applied to an amplifier configured to control the first audio signal;
a dynamic range parameter applied to a dynamic range processor configured to control the first audio signal; and
a dynamic level parameter applied to a dynamic level controller configured to control the first audio signal.

9. The method as claimed in claim 1, wherein generating at least one signal processing parameter dependent on the loudness estimate comprises:
comparing the loudness estimate with a loudness input value; and
generating the at least one signal processing parameter dependent on a difference between the loudness estimate of the first audio signal and the loudness input value.

10. The method as claimed in claim 1, wherein the first audio signal comprises different types of music genres.

11. The method as claimed in claim 1, wherein determining the loudness estimate further comprises applying an acoustic model to estimate perceived loudness, wherein the acoustic model further considers surrounding acoustical properties.

12. The method as claimed in claim 1, further comprising:
adaptively adjusting the at least one signal processing parameter based on the loudness estimate.

13. The method as claimed in claim 1, further comprising:
receiving audio input from an environment to determine surrounding acoustical properties.

14. An apparatus for processing audio and speech signals comprising at least one processor and at least one memory including computer program code, the at least one memory and the computer program code configured to, with the at least one processor, cause the apparatus at least to:
receive an indication for a mode of operation of the apparatus;
receive a first audio signal during the mode of operation;
determine a target loudness level for playback of audio and speech signals based on the mode of operation;
determine whether the first audio signal comprises speech or non-speech frames, wherein said non-speech frames comprise silence or audio portions;
determine a loudness estimate, wherein the loudness estimate is generated for at least one frame when the at least one frame is determined to be speech and the loudness estimate is generated differently for the at least one frame when the at least one frame is determined to be a non-speech signal during the mode of operation;
generate at least one signal processing parameter dependent on the loudness estimate when the at least one frame is the at least one of audio and speech signals during the mode of operation; and
adjust the first audio signal with the at least one signal processing parameter relative to the target loudness level.

15. The apparatus as claimed in claim 14, wherein the at least one memory and the computer program code are further configured to, with the at least one processor, cause the apparatus to apply at least one loudness model to the first audio signal.

16. The apparatus as claimed in claim 15, wherein the at least one loudness model comprises at least one of:
a digital filter; and
a parametric filter.

17. The apparatus as claimed in claim 15, wherein the at least one loudness model stimulates properties of a human auditory system.

18. The apparatus as claimed in claim 14, wherein the at least one loudness model comprises a speech loudness model to be applied to the first audio signal when the first audio signal comprises a speech frame.

19. The apparatus as claimed in claim 14, wherein the at least one memory and the computer program code are further configured to, with the at least one processor, cause the apparatus to apply an environmental model.

20. The apparatus as claimed in claim 19, wherein the environmental model comprises at least one of:
a loudspeaker model comprising at least one filter simulating the audio filtering of an integrated hands free loudspeaker;
an earpiece model comprising at least one filter simulating the audio filtering of an earpiece transducer and housing;
a headset model comprising at least one filter simulating the audio filtering of a predetermined headset; and
a mechanical model comprising at least one filter simulating the mechanical acoustical response of the apparatus.

21. The apparatus as claimed in claim 14, wherein the at least one signal processing parameter comprises at least one of:
a gain control parameter applied to an amplifier configured to control the first audio signal;
a dynamic range parameter applied to a dynamic range processor configured to control the first audio signal; and
a dynamic level parameter applied to a dynamic level controller configured to control the first audio signal.

22. The apparatus as claimed in claim 14, wherein the at least one memory and the computer program code are further configured to, with the at least one processor, cause the apparatus to:
compare the loudness estimate with a loudness input value; and
generate the at least one signal processing parameter dependent on a difference between the loudness estimate of the first audio signal and the loudness input value.

23. The apparatus as claimed in claim 14, wherein the first audio signal comprises different types of music genres.

24. The apparatus as claimed in claim 14, wherein determining the loudness estimate further comprises applying an acoustic model to estimate perceived loudness, wherein the acoustic model further considers surrounding acoustical properties.

25. The apparatus as claimed in claim 14, wherein the at least one memory and the computer program code are further configured to, with the at least one processor, cause the apparatus at least to perform:
adaptively adjust the at least one signal processing parameter based on the loudness estimate.

26. The apparatus as claimed in claim 14, wherein the at least one memory and the computer program code are further configured to, with the at least one processor, cause the apparatus to:

receive audio input from an environment to determine surrounding acoustical properties.

\* \* \* \* \*